United States Patent [19]
Brown

[11] Patent Number: 6,148,432
[45] Date of Patent: *Nov. 14, 2000

[54] INSERTING BUFFERS BETWEEN MODULES TO LIMIT CHANGES TO INTER-MODULE SIGNALS DURING ASIC DESIGN AND SYNTHESIS

[75] Inventor: Jeffrey R. Brown, Plymouth, Minn.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/971,974

[22] Filed: Nov. 17, 1997

[51] Int. Cl.$^7$ ........................................ G06F 17/50
[52] U.S. Cl. .......................... 716/1; 716/2; 716/5
[58] Field of Search .................. 395/500.03, 500.09, 395/500.1, 500.11, 500.12, 500.19, 500.02; 716/2, 8, 10, 11, 18, 1, 5

[56] References Cited

U.S. PATENT DOCUMENTS

| | | | |
|---|---|---|---|
| 4,823,278 | 4/1989 | Kikuchi et al. | 364/491 |
| 5,530,654 | 6/1996 | Takahashi | 364/489 |
| 5,774,371 | 6/1998 | Kawakami | 364/491 |
| 5,883,814 | 3/1999 | Luk et al. | 395/500.09 |
| 5,903,466 | 5/1999 | Beausang et al. | 395/500.2 |
| 5,974,245 | 10/1999 | Li et al. | 395/500.11 |

OTHER PUBLICATIONS

Sato et al "Post–Layout Optimization for Deep Submicron Design," ACM, Jan. 1996, pp. 1–6.

Kannan et al "A Methodology and Algorithm for Post–Placement Delay Optimization," ACM 1994, pp. 327–332.

Wiederhold et al "Deep–Submicron ASIC Design Requires Design Planning," EDN, Feb. 1995, pp. 95–100.

Lillis et al, "Optimal and Efficient Buffer Insertion and Wire Sizing," IEEE, 1995, pp. 259–262.

*Primary Examiner*—Paul R. Lintz
*Assistant Examiner*—Vuthe Siek
*Attorney, Agent, or Firm*—Park & Vaughan LLP

[57] ABSTRACT

One embodiment of the present invention provides a method for designing a circuit that limits the impact of design changes within a module of a circuit to the characteristics of signals flowing between modules of the circuit. This method operates by dividing the circuit into a plurality of circuit modules, and defining a plurality of interface modules located between the plurality of circuit modules. These interface modules include drivers coupled between upstream circuit module outputs and downstream circuit module inputs, so as to isolate the downstream circuit module inputs from the upstream circuit module outputs. Next, the circuit modules and interface modules are designed, and a synthesized circuit is ultimately generated from the designs. This synthesized circuit is then verified for characteristics such as timing. If it fails to verify, design changes are made. In one embodiment, these design changes include: re-specifying constraints for modules, re-generating designs for modules, and re-dividing the circuit into modules. By locating drivers within separate interface modules, the drive strengths of the drivers can be more easily specified. Furthermore, by locating the drivers at particular positions within an interface module, the signals flowing through the drivers can be guided to flow in such a way as to route signals along shorter, more optimal pathways between modules.

27 Claims, 6 Drawing Sheets

INSERTING BUFFERS BETWEEN MODULES TO LIMIT CHANGES TO INTER-MODULE SIGNALS DURING ASIC DESIGN AND SYNTHESIS

BACKGROUND

1. Field of the Invention

This invention relates to designing integrated circuits, and more particularly to a methodology for designing application specific integrated circuits (ASICs) that places buffers between modules of an ASIC so that design changes to an upstream module do not readily propagate to downstream modules and cause design changes to the downstream modules.

2. Related Art

Circuit design is presently accomplished primarily through the use of computer aided design (CAD) tools, which take as input a circuit specification and automatically generate and simulate circuit descriptions suitable for implementation. One type of circuit commonly designed using CAD tools is an application specific integrated circuit (ASIC). ASICs are often very complex. Consequently, design of an ASIC is typically accomplished by dividing an ASIC into a plurality of modules, which are designed separately—often by different designers. This process of dividing an ASIC into modules has a number of advantages. It is more efficient computationally to synthesize and test modules of a circuit independently first, so that module designs are stabilized before synthesizing and testing a complete circuit. Furthermore, breaking up a circuit into separately designed modules allows a circuit to be designed by a group of designers working somewhat independently on separate modules.

However, this process of dividing a circuit gives rise to a number of problems in ultimately recombining the modules into a circuit. For example, a change to an input signal of a module may cause changes to characteristics of an output signal from the module. This may cause the input to a downstream module to change, which may cause an output of the downstream module to change, and so on, until the changes propagate through many modules in the circuit. Each time an output changes, the circuit may have to be re-synthesized and/or re-tested, which can be a very time-consuming process. Consequently, this potential rippling of changes through a circuit can greatly increase the time required to design a circuit, and may ultimately lead to increased costs for the circuit.

Furthermore, if an output signal from a module additionally feeds back into the module, the signal that feeds back into the module may be affected by downstream loads on the output signal. Consequently, downstream connections of the output signal may affect the timing of signals within the module, which may trigger changes in the design of the module.

Additionally, when modules are integrated together, signals are often not routed optimally because output drivers are placed at various locations during the design of a module without regard for the effect of such placement on the optimal routing of signals between modules.

What is needed is a method for designing a circuit that limits the ability of design tools to automatically change the characteristics of signals travelling between modules, so that design changes to a module do not needlessly create design changes in downstream modules of a circuit.

Additionally, what is needed is a method for designing a circuit that insulates output signals that feed back into a module from the effects of loads placed on the output signals outside the module.

Furthermore, what is needed is a method for designing a circuit that carefully locates output drivers for modules of the circuit, so that signals are more optimally routed between modules of a circuit.

SUMMARY

One embodiment of the present invention provides a method for designing a circuit that limits the impact of design changes within a module of a circuit to the characteristics of signals flowing between modules of the circuit. This method operates by dividing the circuit into a plurality of circuit modules, and defining a plurality of interface modules located between the plurality of circuit modules. These interface modules include drivers coupled between upstream circuit module outputs and downstream circuit module inputs, so as to isolate the downstream circuit module inputs from the upstream circuit module outputs. Next, the circuit modules and interface modules are designed, and a synthesized circuit is ultimately generated from the designs. This synthesized circuit is then verified for characteristics such as timing. If it fails to verify, design changes are made. In one embodiment, these design changes include: re-specifying constraints for modules, re-generating designs for modules, and re-dividing the circuit into modules. By locating drivers within separate interface modules, the drive strengths of the drivers can be more easily specified. Furthermore, by locating the drivers at particular positions within an interface module, the signals flowing through the drivers can be guided to flow in such a way as to route signals along shorter, more optimal pathways between modules.

In one embodiment of the present invention, the act of generating a synthesized circuit from the designs includes: generating synthesized modules from the designs; and generating a synthesized circuit from the synthesized modules. In a variation on this embodiment, the method includes verifying functionality of the circuit modules from the design specifications before generating the synthesized modules.

In another embodiment of the present invention, the act of creating designs includes: writing design specifications for circuit modules and interface modules; and specifying constraints for the circuit modules and interface modules. In a variation on this embodiment, the act of specifying constraints includes specifying input and output delays for a module. In another variation on this embodiment, the act of specifying constraints includes specifying load values for outputs from a module.

In another embodiment, the act of defining interface modules includes defining a first interface module as a ring surrounding a first circuit module, so that inputs and/or outputs from the first circuit module pass through the first interface module. In a variation on this embodiment, the ring includes drivers configured so that outputs passing through the ring pass through the drivers. In another variation, a first set of outputs from the first circuit module pass through drivers in the first interface module, and a second set of outputs from the first circuit module pass straight through the first interface module without passing through intervening drivers or other gates in the first interface module. In yet another variation, an interface module takes the form of a ring surrounding a group of circuit modules so that inputs and/or outputs from the group of circuit modules pass through the ring.

In another embodiment of the present invention, the act of verifying the synthesized circuit includes verifying timing for the synthesized circuit.

In another embodiment of the present invention, the method includes generating a placement and a routing for the synthesized circuit.

DETAILED DESCRIPTION OF THE INVENTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Description of Computing System Upon Which the Invention May Operate

Figure 1:
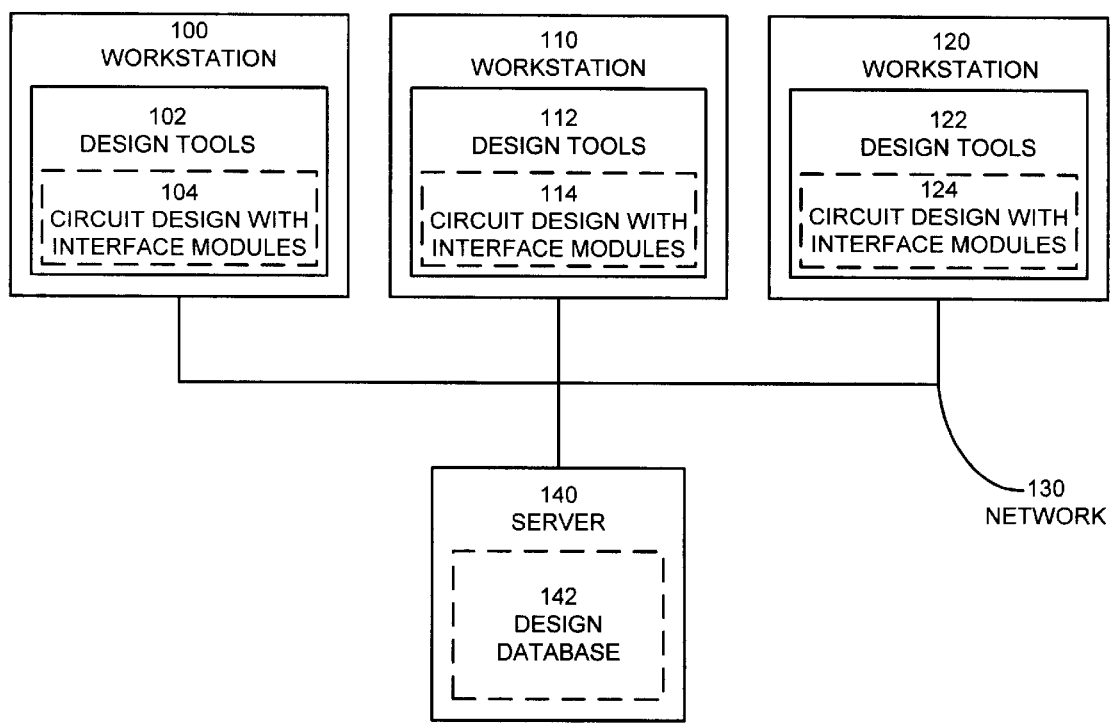
FIG. 1 is a block diagram illustrating a plurality of workstations 100, 110 and 120 coupled through network 130 to server 140 in accordance with an embodiment of the present invention.

FIG. 1 is a block diagram illustrating a plurality of workstations 100, 110 and 120 coupled through network 130 to server 140 in accordance with an embodiment of the present invention. FIG. 1 includes a plurality of workstations 100, 110 and 120, coupled to server 140 through network 130. Workstations 100, 110 and 120 may be any type of computing system on which CAD tools may be run. This includes, but is not limited to, workstations, personal computers, mainframe computers, supercomputers and device controllers. Network 130 may be any type of communication network through which computers can communicate. This includes, but is not limited to, local area networks, such as Ethernet or Token ring networks, and wide area networks, such as the Internet. Server 140 is any type of computational server capable of storing data that can be accessed by other computer systems over network 130.

Workstation 100 includes design tools 102, which are computer aided design (CAD) tools for designing electrical circuitry. In one embodiment, design tools 102 are configured to design application specific integrated circuits (ASICs). In another embodiment, design tools 102 include tools to perform placement and routing of ASIC circuitry, as well as tools to simulate and test ASIC circuitry. In the illustrated embodiment, a circuit design including interface modules 104 resides within design tools 102. Circuit design 104 contains designs for modules, as well as designs for interface modules for buffering signals between modules, as is described below. Workstation 1 10 may similarly include a corresponding set of design tools 112, which may include a corresponding circuit design 114. Workstation 120 may also include a corresponding set of design tools 122, which may include a corresponding circuit design 124.

FIG. 1 illustrates a system with only three workstations, 100, 110 and 120. However, the present invention is applicable to systems including any number of workstations connected to server 140. The present invention may additionally be used on any type of computing system that allows a plurality of designers to access a shared database. In one embodiment, the present invention is achieved on a mainframe computer.

Server 140 may include a data storage medium for storing shared data. In one embodiment, this takes the form of a plurality of magnetic disk drives. Server 140 may also include design database 142, which is any type of database system that permits access by multiple users. Design database 142 may include designs for modules of a circuit, which are ultimately used to design a complete circuit.

Description of Methodology

Figure 2:
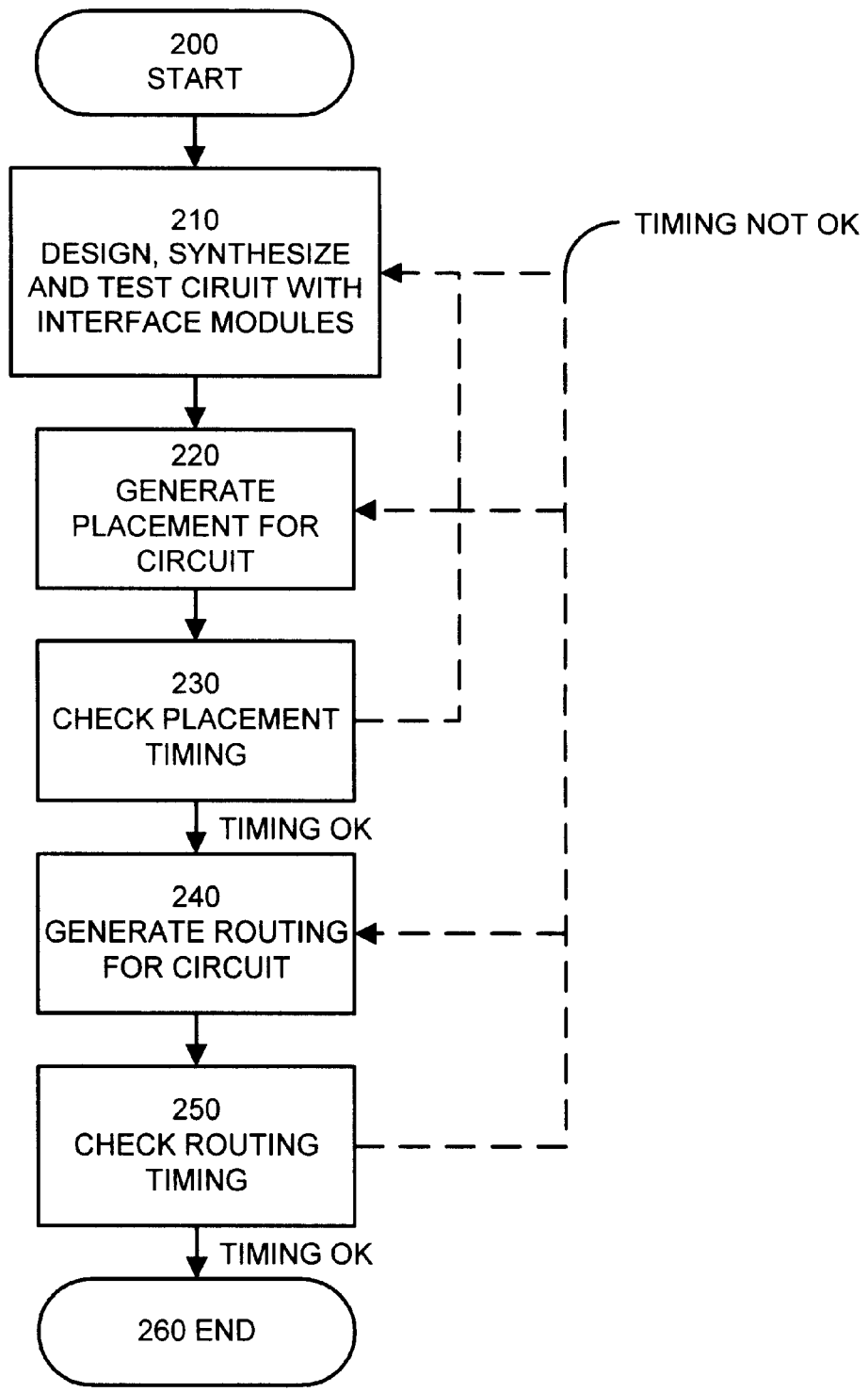
FIG. 2 is a flow chart illustrating some the operations involved in designing a circuit in accordance with an embodiment of the present invention.

FIG. 2 is a flow chart illustrating some the operations involved in designing a circuit in accordance with one embodiment of the present invention. The method starts at state 200, which is a start state. The method next proceeds to state 210, in which the circuit is designed, synthesized and tested. The process of designing involves dividing the circuit into circuit modules, and defining interface modules between the circuit modules. This process can be quite involved, and is described below in more detail with reference to FIGS. 3 and 4. The method next proceeds to state 220, in which the method generates a placement for the synthesized circuit. A placement specifies a physical organization for components in the circuit. The method next advances to state 230, in which timing is checked for the placement. If the timing does not meet requirements, the method may return to state 220 to generate a new placement, or may return all the way back to state 210 to design, synthesize and test the circuit again. In one embodiment, a system user makes the determination of where to return to. In another embodiment, the determination is made by a computer program based upon how far the timing is off. The method next advances to state 240, in which the method generates a routing for the circuit. A routing specifies interconnection pathways between components in the circuit. The method then advances to state 250, in which timing is checked for the routing. If the timing does not meet requirements, the method may return to state 240 to generate a new routing. It may also return to state 220 to generate a new placement for the circuit, or may return to state 210 to design, synthesize and test the circuit again. Again, in one embodiment, the system user makes the determination of where to return to. In another embodiment, the determination is made by a computer program based upon how far the timing is off. The system next proceeds to state 260, which is an end state.

Figure 3:
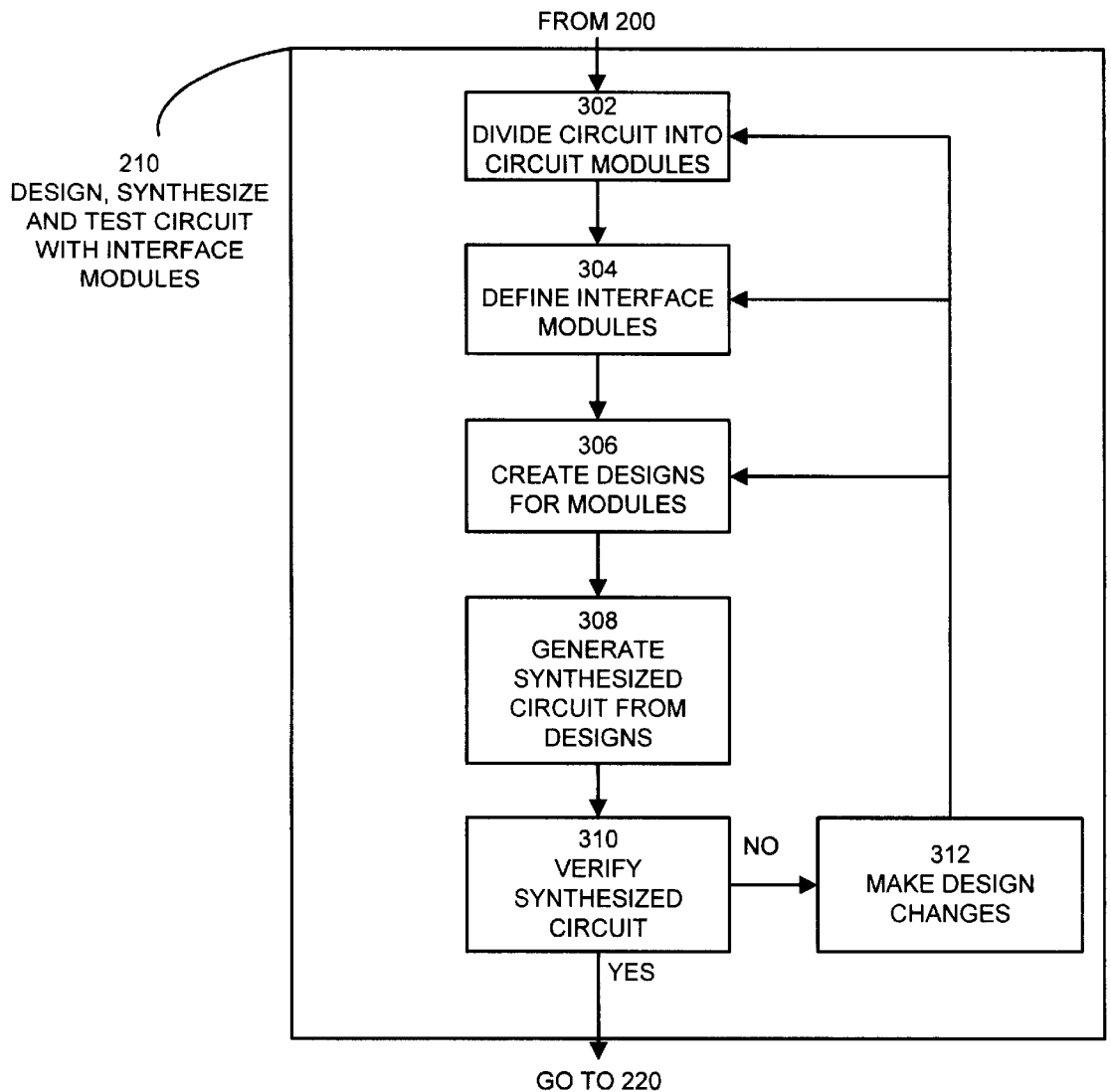
FIG. 3 is a flow chart illustrating some of the operations involved in designing, synthesizing and testing a circuit including interface modules in accordance with an embodiment of the present invention.

FIG. 3 is a flow chart illustrating some of the operations involved in designing, synthesizing and testing a circuit with interface modules in accordance with an embodiment of the present invention. FIG. 3 is a more-detailed flow chart of the actions involved in state 210 of FIG. 2. The method starts in state 302, in which the circuit is divided into a plurality of circuit modules to be separately designed. The circuit is ideally divided into modules so as to minimize the number of critical signals flowing between modules.

The method next proceeds to state 304, in which interface modules are defined. In one embodiment, the interface modules are in the form of rings surrounding individual modules or groups of modules. In another embodiment, the interface modules are in the form of partitions separating signals that pass between modules or groups of modules.

The interface modules include drivers, through which the inter-module signals pass. These drivers (also called buffers), can be any type of circuit that receives an input signal, and outputs the same signal in a form that is powered by a power source from within the driver. For example, in one embodiment of the present invention, two inverters chained together forms a driver. In another embodiment, a driver is a single inverter, which inverts the signal values of an input signal. In another embodiment, some of the signals pass straight through the interface module without passing through a driver. This may be necessary for a signal in a critical path that cannot tolerate an additional driver delay.

In one embodiment, the drivers insulate downstream module inputs from design changes in upstream module outputs. These design changes may affect the drive strength of the upstream module outputs, which will affect the timing of signals flowing into downstream module inputs. The drivers additionally insulate outputs of a module, which feed back into the module, from the effects of changing downstream loads on the outputs. Without the intervening drivers in the interface modules, the timing of signals that feed back into the module may be affected by changing downstream loads on the modules. After the interface modules are defined, the method proceeds to state 306.

In state 306 the method creates designs for modules. In one embodiment, these designs take the form of a VHSIC Hardware Description Language (VHDL) specification of the modules within the circuit. (VHSIC is a Department of Defense acronym that stands for Very High Speed Integrated Circuits.) The VHDL standard has been codified in Institute for Electrical and Electronic Engineers (IEEE) standard 1076-1993.

The method next proceeds to state 308. In state 308, the method generates a synthesized circuit from the designs for the modules. In this embodiment, the synthesized circuit specifies logic gates for circuit, and interconnections between the logic gates. However, in this embodiment, the synthesized circuit does not include placement and/or routing information for circuitry within the circuit. The method next proceeds to state 310, in which the method verifies the synthesized circuit. In one embodiment, this verification process includes verifying timing for the circuit. If the circuit properly verifies, the method proceeds to state 220 in FIG. 2. If the circuit does not properly verify, the method proceeds to state 312. In state 312, the method makes design changes. In one embodiment, these design changes include: re-specifying constraints for modules, re-writing design specifications for modules, and re-dividing the circuit into modules.

Figure 4:
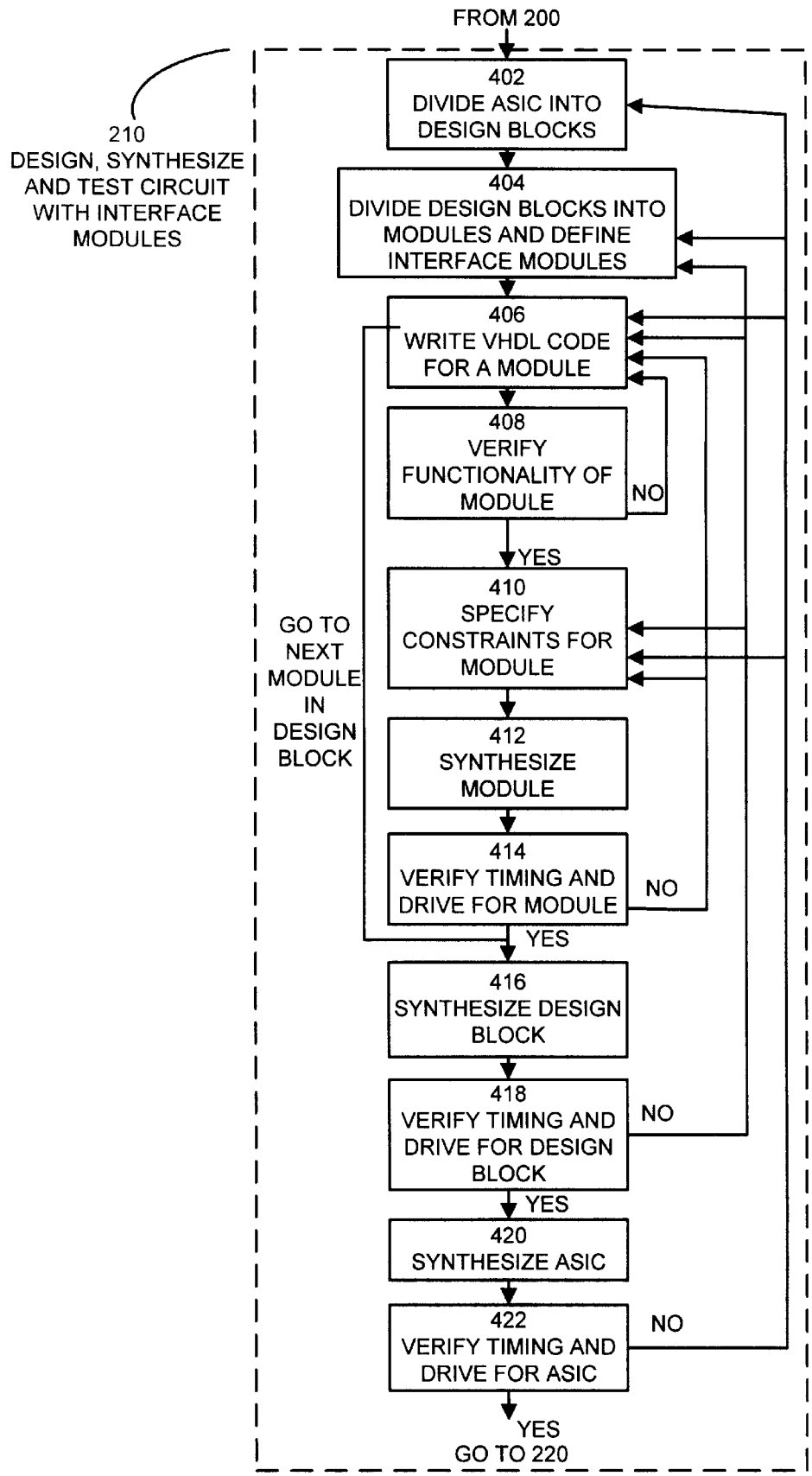
FIG. 4 is a more-detailed flow chart illustrating some of the operations involved in designing, synthesizing and testing a circuit including interface modules in accordance with an embodiment of the present invention.

FIG. 4 is a flow chart illustrating some of the operations involved in designing, synthesizing and testing a circuit with interface modules in accordance with an embodiment of the present invention. FIG. 4 is an even more-detailed flow chart than that of FIG. 3, which describes the actions involved in state 210 of FIG. 2. The method illustrated in FIG. 4 starts at state 402, in which the circuit is divided into design blocks. In one embodiment, these design blocks are sub-units of a circuit that may be separately designed by different designers. In this embodiment, design blocks may include multiple circuit modules. The system next proceeds to state 404 in which the design blocks are divided into circuit modules, and interface modules are defined. In one embodiment, interface modules are in the form of rings surrounding individual modules of a circuit. In another embodiment, interface modules are in the form of rings surrounding design blocks of a circuit, where the design blocks include multiple modules of the circuit. In this embodiment, a single designer typically works on all of the modules within a design block. This designer ensures that signals passing between modules within a design block have proper characteristics, such as drive strength, so that changes to output signals of an upstream module do not lead to changes in the design of a downstream module. However, when signals leave the design block, they pass through drivers in an interface module. These drivers insulate signals leaving the design block from design changes within the design block. The method next proceeds to state 406.

In state 406, the method writes a specification for a module in VHDL code. In this example, VHDL code is used to specify a module. However, any method for specifying functionality for a module can be used. The method next proceeds to state 408, in which the system verifies finctionality of the module. This entails verifying that the VDHL description of the module meets functional requirements for the module. The method next proceeds to state 410.

In state 410, the method specifies constraints for the module. In one embodiment, these constraints include input delays, for input signals into the module, and output delays for output signals leaving the module. These constraints may also include output loads on outputs from the module, which can include both wire load and the load resulting from additional gates being coupled to an output. The method next proceeds to state 412.

In state 412, the method synthesizes at least one module. This may involve using a synthesis tool on the design for the module in order to create a set of logic gates and interconnections between logic gates for the module. The method then proceeds to state 414. In state 414, the synthesized module is verified. In one embodiment, this involves verifying the timing of signals through the module and verifying the drive strength of outputs from the module. If the module properly verifies, the system returns to state 406 to write VHDL code for the next module or, if no modules remain, it proceeds to state 416. In this embodiment, if the module does not properly verify, the method may either, return to state 410 to re-specify constraints, or it may return to state 406 to re-write the description for the module. In one embodiment, a system user makes the determination of where to return to. In another embodiment, the determination is made by a computer program based upon results of the verification.

In state 416, the method synthesizes a design block. In one embodiment, the design block is synthesized by combining synthesized modules. In another embodiment, the design block is synthesized directly from VDHL descriptions of the constituent modules of the design block. The method next proceeds to state 418. In state 418, the synthesized design block is verified. In one embodiment, this involves verifying the timing of signals through the design block and verifying the drive strength of outputs from the design block. If the design block properly verifies, the method proceeds to state 420. In this embodiment, if the design block does not properly verify, the method can either: return to state 410 to re-specify constraints; return to state 406 to re-write a description for a module; or return to state 404 to re-divide the design block into modules. In one embodiment, a system user makes the determination of where to return to. In another embodiment, the determination is made by a computer program based upon results of the verification.

In state 420, the method synthesizes the ASIC. In one embodiment, the ASIC is synthesized by combining synthesized design blocks or modules. In another embodiment, the ASIC is synthesized directly from VDHL descriptions of the constituent modules of the ASIC. The method next proceeds to state 422. In state 414, the synthesized ASIC is verified. If the ASIC properly verifies, the method proceeds to state 220 in FIG. 2. In this embodiment, if the ASIC does not properly verify, the method can either: return to state 410 to re-specify constraints; return to state 406 to re-write a description for a module; return to state 404 to re-divide the design blocks into modules; or return to state 402 to re-divide the ASIC into design blocks. In one embodiment, a system user makes the determination of where to return to. In another embodiment, the determination is made by a computer program based upon results of the verification.

Description of Example

Figure 5:
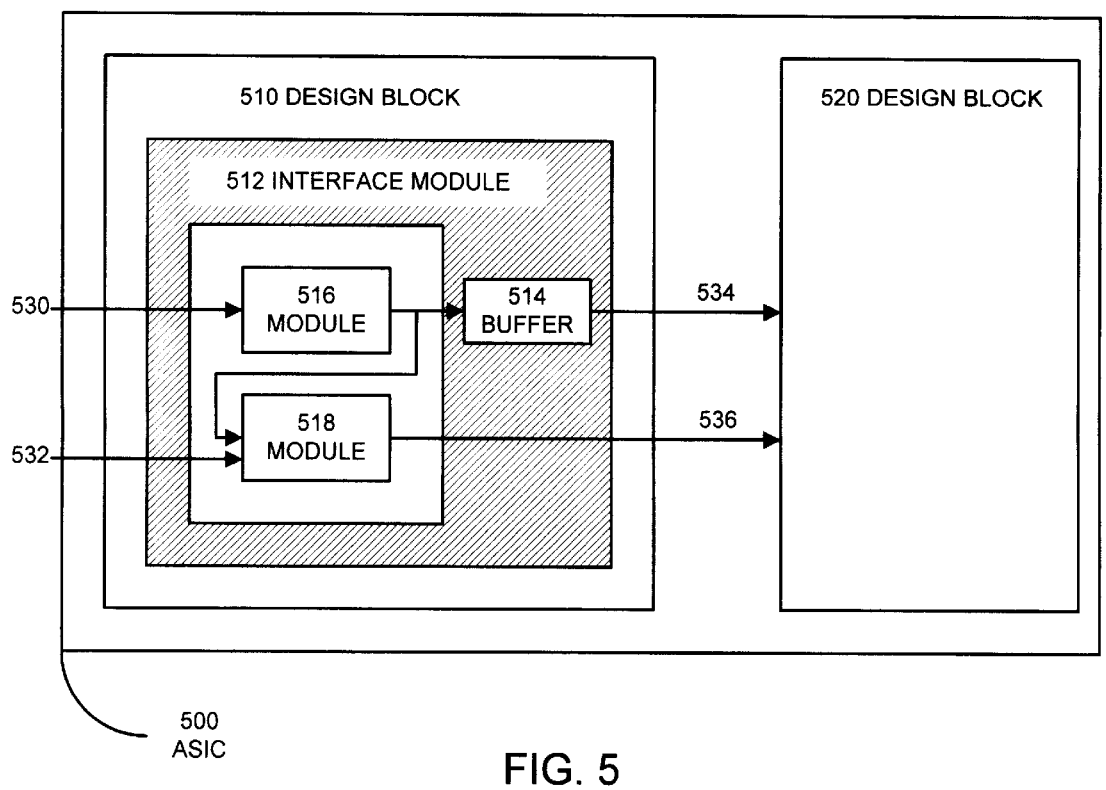
FIG. 5 is a block diagram illustrating an example of a circuit designed in accordance with an embodiment of the present invention.

FIG. 5 is a block diagram illustrating an example of a circuit design in accordance with an embodiment of the present invention. In this example, an ASIC 500 is divided into two design blocks 510 and 520. Design block 510 includes two inputs, 530 and 532, and two outputs, 534 and 536. Design block 520 includes two inputs, 534 and 536, which are taken from outputs of design block 510.

FIG. 5 also illustrates the internal structure of design block 510. Design block 510 includes two circuit modules 516 and 518. These circuit modules are surrounded by interface module 512. Inputs and outputs to design block 510 pass through interface module 512. More specifically, input 530 passes through interface module 512 into module 516, and input 532 passes through interface module 512 into module 518. Output 534 originates from module 516 and passes through buffer 514 within interface module 512 before feeding into downstream design block 520. Output 536 originates from module 518 and passes straight through interface module 512 before feeding into downstream design block 520.

Figure 6:
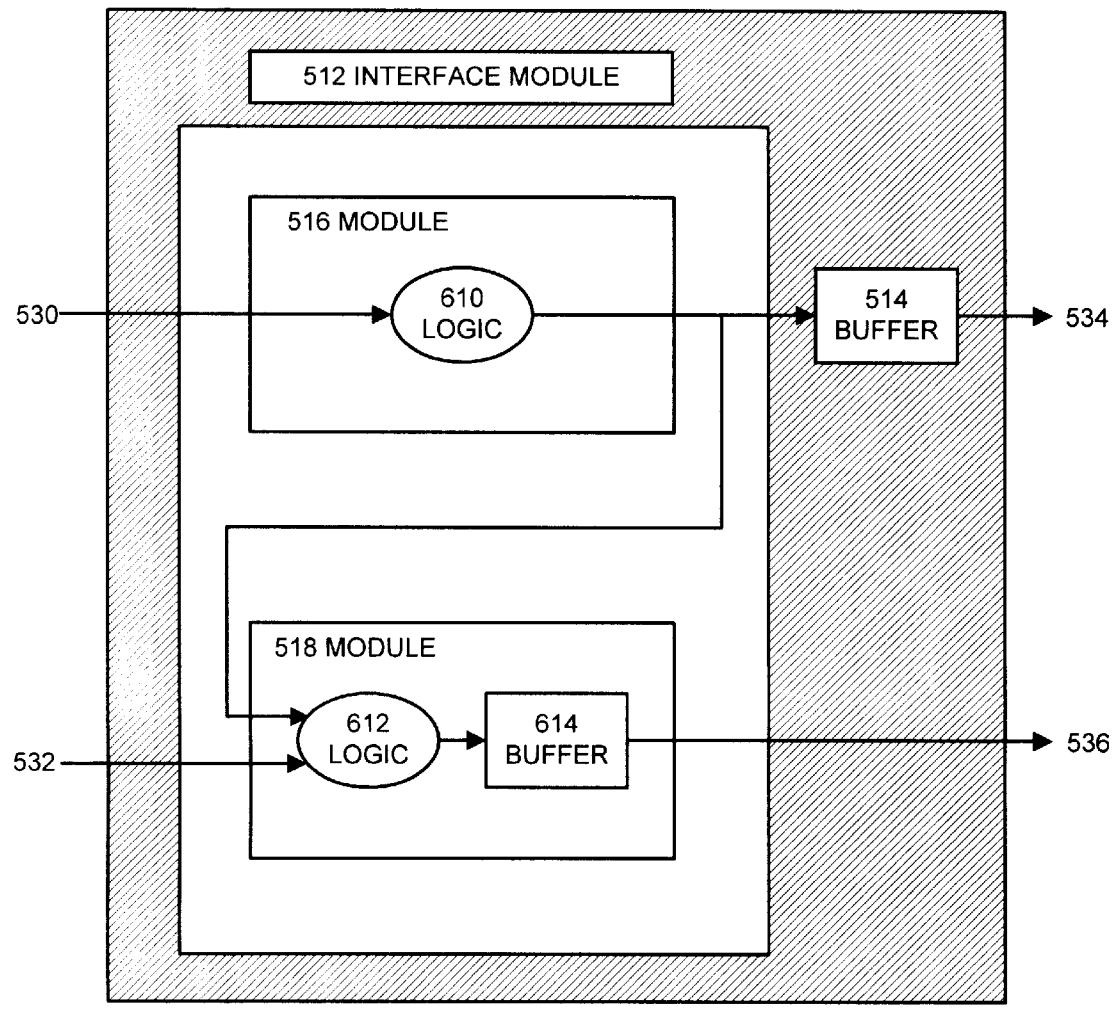
FIG. 6 is a block diagram illustrating the internal structure of a module in an example of a circuit designed in accordance with an embodiment of the present invention.

FIG. 6 illustrates the internal structure of modules 516 and 518 in more detail. Module 516 includes logic 610, which receives signal 530 as an input, and generates an output which passes into buffer 514. Module 518 includes logic 612 and buffer 614. Logic 612 takes an input from signal 532 and an input from the output of logic 610. Logic 612 uses these inputs to generate an output that feeds through buffer 614 into output signal 536.

The example illustrated in FIGS. 5 and 6 operates as follows. Once the circuit is divided into modules and design blocks, as illustrated in FIGS. 5 and 6, the method specifies the drive strength for output buffers in interface modules by changing constraints on the input and output signals for the interface modules. In one embodiment, these constraints include delay and load parameters, where the delay for a signal is equal to the input delay for the signal minus the output delay for the signal. For example, to change the size of the driver within buffer 514, the input and output delays for buffer 514 are held to a constant value, and the load at the output of buffer 514 is varied. Once these constraints are specified, the CAD system uses them to determine the size of the output driver within buffer 514.

In contrast, it is much harder to tie down the size of the driver within buffer 614, because buffer 614 is within module 518, and the design of buffer 614 can consequently be affected by design changes within module 518. For example, the delay through logic 612 can change depending upon how the inputs to logic 612 change and how logic 612 ultimately synthesizes into logic gates. The input delay into logic 612 can change if logic 610 within module 516 changes, or if input signal 532 changes.

By fixing the drive strength of buffer 514, downstream module inputs coupled to buffer 514 will not be affected by changes in the drive strength of buffer 514 when the logic within module 516 is changed. In contrast, a simple change to the constraints or internal design of module 518 can change the drive strength of buffer 614, which could change the signals received by downstream module inputs, triggering further design changes in the downstream modules. By fixing driver sizes within interface modules, this embodiment of the present invention reduces potential propagation of design changes to downstream modules, and will typically reduce the design time for a circuit as a whole.

Furthermore, buffer 514 isolates the output of module 516 from downstream loads placed on output signal 534. If buffer 514 were not present, the output of module 516, which feeds into module 518, might be affected by additional loads placed on output 534. This could affect timing on the corresponding input to module 518, which could necessitate altering the design of circuitry within module 518. The isolation provided by module 518 prevents this possible side effect.

In another embodiment, the drive strengths of buffers in interface module 512 are fixed directly, without having to specify constraints on the input and output signals of interface module 512.

In yet another embodiment, interface modules are not inserted between circuit modules. Instead, the CAD tools provide a mechanism that allows drive strengths of module outputs to be explicitly fixed, so that drive strengths of output signals from a module are not affected by changing constraints on input and output signals of the module, or changes to circuitry within the module.

One embodiment of the present invention further provides for a "pass through" option, allowing signals to pass straight through an interface module, as is illustrated by output 536 from module 518. A signal in a critical path may not require the drive strength of an external buffer, and may not be able to tolerate the additional delay of such a buffer. This embodiment allows critical signals of this type to pass straight through an interface module without passing through a buffer.

One embodiment of the present invention provides for locating drivers within an interface module in such a way as to guide signals that pass between modules along shorter, more optimal routings between modules. By locating the drivers at particular positions in an interface module, the signals flowing through the drivers are forced to flow through these locations. In this way, the router can be guided to route signals along more optimal pathways.

Definitions

Circuit modules—modules containing circuitry.

Interface modules—modules containing circuitry to connect signals passing between circuit modules.

Design—a specification for a circuit or a subset of a circuit.

Design block—a group of modules, possibly functionally related.

Design specification—same as a design.

Module—any subset of a circuit that can be divided from the circuit.

Upstream module—a module which outputs a signal that feeds as an input into another module.

Downstream module—a module which receives a signal from an upstream module.

Verification—testing characteristics of a circuit, a design block or a module. In one embodiment, these characteristics include timing for signals.

The foregoing descriptions of embodiments of the invention have been presented for purposes of illustration and description only. They are not intended to be exhaustive or to limit the invention to the forms disclosed. Obviously, many modifications and variations will be apparent to practitioners skilled in the art.

What is claimed is:

1. A method for designing a circuit, comprising:

dividing the circuit into a plurality of circuit modules, the circuit modules including circuit module inputs and circuit module outputs for carrying a plurality of signals between the circuit modules;

before designing the plurality of circuit modules, defining a plurality of buffer modules between the plurality of circuit modules, so that signals passing between the circuit modules pass through the plurality of buffer modules, the plurality of buffer modules including drivers of fixed drive strength coupled between upstream circuit module outputs and downstream circuit module inputs, so that changes in the designs of upstream circuit modules do not affect the drive strengths of signals feeding into downstream circuit modules;

wherein defining the plurality of buffer modules includes defining a first buffer module as a ring surrounding a first circuit module, so that a first set of outputs from the first circuit module pass through drivers in the first buffer module, and a second set of outputs from the first circuit module pass straight through the first buffer module without passing through intervening drivers in the first buffer module;

creating a plurality of designs for the plurality of circuit modules and the plurality of buffer modules in a high-level design language;

synthesizing the circuit from the plurality of designs;

wherein synthesizing the circuit involves converting the circuit from a high-level design language form into a netlist form;

verifying that the synthesized circuit meets a set of timing constraints; and making design changes if the synthesized circuit fails to meet the set of timing constraints.

2. The method of claim 1, wherein the act of synthesizing the circuit from the plurality of designs includes:

synthesizing the plurality of circuit modules from the plurality of designs; and synthesizing the circuit form the plurality of circuit modules.

3. The method of claim 2, including verifying that the synthesized circuit modules meet the set of timing constraints before synthesizing the circuit.

4. The method of claim 1, wherein the act of creating a plurality of designs includes:

writing design specifications for the plurality of circuit modules and the plurality of buffer modules in the high-level design language; and specifying constraints for the plurality of circuit modules and the plurality of buffer modules.

5. The method of claim 4, wherein the act of specifying constraints includes specifying an input delay for an input to a module.

6. The method of claim 4, wherein the act of specifying constraints includes specifying an output delay for an output from a module.

7. The method of claim 4, wherein the act of specifying constraints includes specifying a load value for an output from a module.

8. The method of claim 4, wherein the act of specifying constraints includes specifying a driver size for a driver in a module.

9. The method of claim 4, wherein the act of making design changes includes re-specifying constraints for the plurality of circuit modules.

10. The method of claim 4, wherein the act of making design changes includes re-specifying constraints for the plurality of buffer modules.

11. The method of claim 4, wherein the act of making design changes includes re-writing design specifications for the plurality of circuit modules.

12. The method of claim 4, wherein the act of making design changes includes re-writing design specifications for the plurality of buffer modules.

13. The method of claim 1, wherein the act of making design changes includes re-dividing the circuit into a plurality of circuit modules.

14. The method of claim 2, including verifying that the plurality of synthesized circuit modules meet the set of timing constraints before synthesizing the plurality of circuit modules from the plurality of designs.

15. The method of claim 1, including generating a placement for the circuit.

16. The method of claim 1, including generating a routing for the circuit.

17. The method of claim 1, wherein the act of defining the plurality of buffer modules includes defining a first buffer module as a ring surrounding a first circuit module, so that outputs from the first circuit module pass through the first buffer module.

18. The method of claim 1, wherein the act of defining the plurality of buffer modules includes defining a first buffer module as a ring surrounding a first circuit module, so that outputs from the first circuit module pass through drivers in the first buffer module.

19. The method of claim 1, wherein the act of defining the plurality of buffer modules includes defining a first buffer module as a ring surrounding a first circuit module, so that inputs from the first circuit module pass through the first buffer module.

20. The method of claim 1, wherein the act of defining the plurality of buffer modules includes defining a first buffer module as a ring surrounding a first circuit module, so that inputs to the first circuit module pass through drivers in the first buffer module.

21. The method of claim 1, wherein the act of defining the plurality of buffer modules includes defining a first buffer module as a ring surrounding a first circuit module, so that inputs and outputs to the first circuit module pass through drivers in the first buffer module.

22. The method of claim 1, wherein the act of defining the plurality of buffer modules includes defining a first buffer module as a ring surrounding a first group of circuit modules from the plurality of circuit modules, so that outputs from the first group of circuit modules pass through the first buffer module.

23. The method of claim 1, wherein the act of defining the plurality of buffer modules includes defining a first buffer module as a ring surrounding a first group of circuit modules from the plurality of circuit modules, so that inputs to the first group of circuit modules pass through the first buffer module.

24. The method of claim 1, wherein the act of verifying the circuit includes verifying timing for the circuit.

25. A method for designing a circuit, comprising:

dividing the circuit into a plurality of circuit modules, the plurality of circuit modules including circuit module inputs and circuit module outputs for carrying signals between the circuit modules;

before designing the plurality of circuit modules, defining a plurality of buffer modules between the plurality of circuit modules, so that signals passing between the circuit modules pass through the plurality of buffer modules, the plurality of buffer modules including drivers of fixed drive strength coupled between upstream circuit module outputs and downstream circuit module inputs, so that changes in the designs of upstream circuit modules do not affect the drive strengths of signals feeding into downstream circuit modules;

wherein defining the plurality of buffer modules includes defining a first buffer module as a ring surrounding a first circuit module, so that a first set of outputs from the first circuit module pass through drivers in the first buffer module, and a second set of outputs from the first circuit module pass straight through the first buffer module without passing through intervening drivers in the first buffer module;

writing design specifications for the plurality of circuit modules and the plurality of buffer modules in a high-level design language;

specifying constraints for the plurality of circuit modules and the plurality of buffer modules;

synthesizing the plurality of circuit modules from the design specifications;

wherein synthesizing the plurality of circuit modules involves converting the plurality of circuit modules from the high-level design language form into a netlist form;

synthesizing the circuit from the plurality of circuit modules;

verifying that the synthesized circuit meets a set of timing constraints; and making design changes if the synthesized circuit fails to meet the set of timing constraints.

26. A method for designing a circuit, comprising:

dividing the circuit into a plurality of circuit modules, the circuit modules including circuit module inputs and circuit module outputs for carrying a plurality of signals between the circuit modules;

before designing the plurality of circuit modules, defining a plurality of buffer modules as rings surrounding groups of modules from the plurality of circuit modules, so that signals passing between the groups of modules pass through the plurality of buffer modules, the plurality of buffer modules including drivers of fixed drive strength coupled between upstream circuit module outputs and downstream circuit module inputs, so that changes in the designs of upstream circuit modules do not affect the drive strengths of signals feeding into downstream circuit modules;

wherein defining the plurality of buffer modules includes defining a first buffer module as a ring surrounding a first circuit module, so that a first set of outputs from the first circuit module pass through drivers in the first buffer module, and a second set of outputs from the first circuit module pass straight through the first buffer module without passing through intervening drivers in the first buffer module;

writing design specifications for the plurality of circuit modules and the plurality of buffer modules in a high-level design language;

specifying constraints for the plurality of circuit modules and the plurality of buffer modules, the constraints including output delays and output loads;

synthesizing the plurality of circuit modules from the design specifications;

wherein synthesizing the plurality of circuit modules involves converting the plurality of circuit modules from the high-level design language form into a netlist form;

verifying that the plurality of synthesized circuit modules met a set of timing constraints;

synthesizing the circuit from the plurality of circuit modules;

verifying that the synthesized circuit meets a set of timing constraints; and if the synthesized circuit fails to meet the set of timing constraints, making design changes from the group of, re-specifying constraints for modules, re-writing design specifications for modules, and re-dividing the circuit into a plurality of modules.

27. A method for designing a circuit, comprising:

dividing the circuit into a plurality of design blocks;

dividing a design block in the plurality of design blocks into a plurality of circuit modules, the circuit modules including circuit module inputs and circuit module outputs for carrying signals between the circuit modules;

before designing the plurality of circuit modules, defining a plurality of buffer modules between the plurality design blocks, so that signals passing between the design blocks pass through the plurality of buffer modules, the plurality of buffer modules including drivers of fixed drive strength coupled between upstream design block outputs and downstream design block inputs, so that changes in the designs of upstream circuit modules do not affect the drive strengths of signals feeding into downstream circuit modules;

wherein defining the plurality of buffer modules includes defining a first buffer module as a ring surrounding a first circuit module, so that a first set of outputs from the first circuit module pass through drivers in the first buffer module, and a second set of outs from the first circuit module pass straight through the first buffer module without passing through intervening drivers in the first buffer module;

writing design specifications for the plurality of circuit modules and the plurality of buffer modules in a high-level design language;

specifying constraints for the plurality of circuit modules and the plurality of buffer modules;

synthesizing the plurality of circuit modules from the design specifications;

wherein synthesizing the plurality of circuit modules involves converting the plurality of circuit modules from the high-level design language form into a netlist form;

synthesizing a design block from the plurality of circuit modules;

verifying that the synthesized design block meets a set of timing constraints;

making design changes if the synthesized design block fails to meet the set of timing constraints;

synthesizing the circuit from the design block and other design blocks for the circuit;

verifying that the synthesized circuit meets the set of timing constraints; and making design changes if the synthesized circuit fails to meet the set of timing constraints.

* * * * *